(12) United States Patent  
Bohn et al.

(10) Patent No.: US 9,568,368 B2  
(45) Date of Patent: Feb. 14, 2017

(54) MOBILE DEVICE USED WITH ISOLATED TEST AND MEASUREMENT INPUT BLOCK

(71) Applicant: Fluke Corporation, Everett, WA (US)

(72) Inventors: Christopher J. Bohn, Bothell, WA (US); Michael D. Stuart, Issaquah, WA (US); Jeffrey M. Elrod, Seattle, WA (US); Derrick M. Jones, Keller, TX (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 14/855,864

(22) Filed: Sep. 16, 2015

(65) Prior Publication Data

US 2016/0076943 A1     Mar. 17, 2016

Related U.S. Application Data

(60) Provisional application No. 62/051,922, filed on Sep. 17, 2014.

(51) Int. Cl.
*H04B 17/00* (2015.01)
*H04W 24/00* (2009.01)
(Continued)

(52) U.S. Cl.
CPC ........... *G01J 5/02* (2013.01); *G01R 19/00* (2013.01); *H04M 1/7253* (2013.01);
(Continued)

(58) Field of Classification Search
CPC . G01R 15/125; G01R 15/14; G01R 31/31701; G01R 31/3183; G01R 31/31905; G01R 31/3271; H04B 17/00; H04B 17/309
(Continued)

(56) References Cited

U.S. PATENT DOCUMENTS 7,535,002 B2     5/2009  Johnson et al.
7,810,001 B2 *  10/2010  Zhou ................ G01R 31/31907
                                                              714/724
(Continued)

FOREIGN PATENT DOCUMENTS

EP    2230605 A1    9/2010
EP    2683146 A1    1/2014

OTHER PUBLICATIONS

U.S. Appl. No. 62/219,415, filed Sep. 16, 2015, and entitled "Systems and Methods for Placing an Imaging Tool in a Test and Measurement Tool," 26 pages.
(Continued)

*Primary Examiner* — Simon Nguyen
(74) *Attorney, Agent, or Firm* — Fredrikson & Byron, P.A.

(57) ABSTRACT

Systems can include a mobile device, an accessory configured to generate data representative of at least one parameter of a device under test, and an isolated test block comprising at least one input for interfacing with the accessory and an output configured to communicate accessory output data. The mobile device can include a display and be configured to receive the accessory output data from the isolated test block and to present a display based at least on received accessory output data. The accessory output data received by the mobile device can be electrically isolated from the accessory to provide protection to a device user and the mobile device.

22 Claims, 7 Drawing Sheets

(51) Int. Cl.
  *G01J 5/02* (2006.01)
  *H04M 1/725* (2006.01)
  *G01R 19/00* (2006.01)
  *G01J 5/00* (2006.01)
  *H04M 1/02* (2006.01)
  *H04M 1/18* (2006.01)

(52) U.S. Cl.
  CPC ....... *H04M 1/72527* (2013.01); *G01J 5/0265* (2013.01); *G01J 2005/0077* (2013.01); *H04M 1/0254* (2013.01); *H04M 1/18* (2013.01)

(58) Field of Classification Search
  USPC .................. 455/423–425, 67.11–67.12, 67.7
  See application file for complete search history.

(56) References Cited

U.S. PATENT DOCUMENTS

| | | | |
|---|---|---|---|
| 9,264,154 B1* | 2/2016 | Laun | H04B 17/00 |
| 2005/0107976 A1* | 5/2005 | Klijn | G01R 31/3272 |
| | | | 702/118 |
| 2006/0046793 A1 | 3/2006 | Hamilton et al. | |
| 2006/0282736 A1* | 12/2006 | Schroth | G01R 31/3183 |
| | | | 714/742 |
| 2008/0204034 A1* | 8/2008 | Blades | G01R 31/041 |
| | | | 324/522 |
| 2009/0158849 A1* | 6/2009 | Gregg | H04R 29/00 |
| | | | 73/584 |
| 2010/0164527 A1* | 7/2010 | Weyh | G01R 31/31907 |
| | | | 324/750.3 |
| 2010/0240317 A1* | 9/2010 | Giles | H04B 17/309 |
| | | | 455/67.13 |
| 2011/0185048 A1 | 7/2011 | Yew et al. | |
| 2013/0006570 A1* | 1/2013 | Kaplan | G01R 1/06788 |
| | | | 702/125 |
| 2014/0278259 A1 | 9/2014 | Neeley et al. | |
| 2015/0054492 A1* | 2/2015 | Mende | G01R 15/125 |
| | | | 324/115 |
| 2015/0185251 A1* | 7/2015 | Heydron | G01R 15/00 |
| | | | 324/754.02 |

OTHER PUBLICATIONS

International Search Report and Written Opinion for PCT/US2015/050575, Date of Mailing: Dec. 23, 2015, 15 pages.
Ti125, Ti110, Ti105, Ti100, Ti95 and Ti90 Industrial-Commercial Imagers, May 31, 2014, Retrieved from URL:http://www.farnell.com/datasheets/1829 789.pdf; 4 pages.
Fluke 3000 FC Series Test Tools Fluke, Mar. 31, 2014, Retrieved from URL:http://www.mouser.com/catalog/specsheets/Fluke; 12 pages.
Fluke Connect TM Wi-Fi Connection to Thermal Imager, May 31, 2014, Retrieved from URL:http://www.bergeng.com/mm5/downloads/fluke/FC__ti90__qreng000.pdf; 2 pages.

\* cited by examiner

US 9,568,368 B2

MOBILE DEVICE USED WITH ISOLATED TEST AND MEASUREMENT INPUT BLOCK

CROSS-REFERENCES

This application claims the benefit of U.S. Provisional Application No. 62/051,922, filed Sep. 17, 2014, the content of which is hereby incorporated by reference in its entirety.

BACKGROUND

Mobile devices such as smartphones, tablets, and the like are becoming more and more powerful. Processing and display capabilities provide users with abilities to perform many tasks using a single mobile device. However, some measurement tasks are difficult to perform using a typical mobile device for various safety and other operability reasons. For example, high voltage or power electrical measurements may place an operator of the mobile device, and in some cases, the mobile device itself, at danger of damaging electrical signals. In some instances, the mobile device may not include sufficient insulation mechanisms for protecting a user if the mobile device were to reach a high voltage. Accordingly, while the processing and display capabilities of the mobile device may be suitable for performing and/or displaying various measurements, the functionality of the mobile device itself may be limited to only certain low voltage or power measurements.

SUMMARY

Embodiments of the invention are directed to systems and methods for enabling a user to perform various processing, measurement, and/or display tasks using a mobile device. In some examples, systems include a mobile device, an isolated test block capable of providing an output to the mobile device, and an accessory configured to generate data representative of a device under test. The isolated test block can include an input for interfacing with the accessory and configured to receive accessory input data representative of the at least one parameter of the device under test, and an output configured to communicate with the mobile device.

In some examples, the isolated test block provides accessory output data to the mobile device corresponding to the accessory input data. The mobile device can present a display based on received accessory output data from the isolated test block. The isolated test block can function such that the accessory output data received by the mobile device is electrically isolated from the accessory itself. Accordingly, the mobile device may receive a signal based on at least one parameter of the device under test (via the accessory) while remaining electrically isolated from the object.

The isolated test block may communicate with the mobile device via wired or wireless communication. In some examples, the isolated test block may be removably attached to the mobile device. For example, in some embodiments, the mobile device can be inserted into the isolated test block such that, when the mobile device is inserted, the isolated test block surrounds the perimeter of the mobile device.

Exemplary systems can include at least one imaging device including a sensory array configured to receive radiation from a target scene and generate image data representative of the target scene. In some embodiments, the isolated test block comprises that least one imaging device and the mobile device is configured to receive image data from the isolated test block. The at least one imaging device can include one or both of infrared and visible light imaging devices for generating infrared and visible light image data for display, respectively.

DETAILED DESCRIPTION

Embodiments of the invention generally relate to an isolated input block for use with a mobile display and processing device such as a tablet, a mini-tablet, or a smartphone. The mobile display and processing device ("mobile device") can be connected to an accessory, such as an electrically isolated measurement input block or device, via the isolated input block. In some such embodiments, the mobile device can be used for the at least one of the display or processing (primary or secondary) of test and measurement data generated by the accessory. Thus, in various examples, the isolated input block can include a variety of sensors, sensor input jacks, or connections for use with accessories. Accessories can interface with the isolated input block to provide test and measurement data and signals to the isolated input block. The test and measurement data acquired and provided by one or more accessories can be processed by either the isolated input block or the mobile device. Received data can be displayed on the display of the mobile device.

Figure 1:
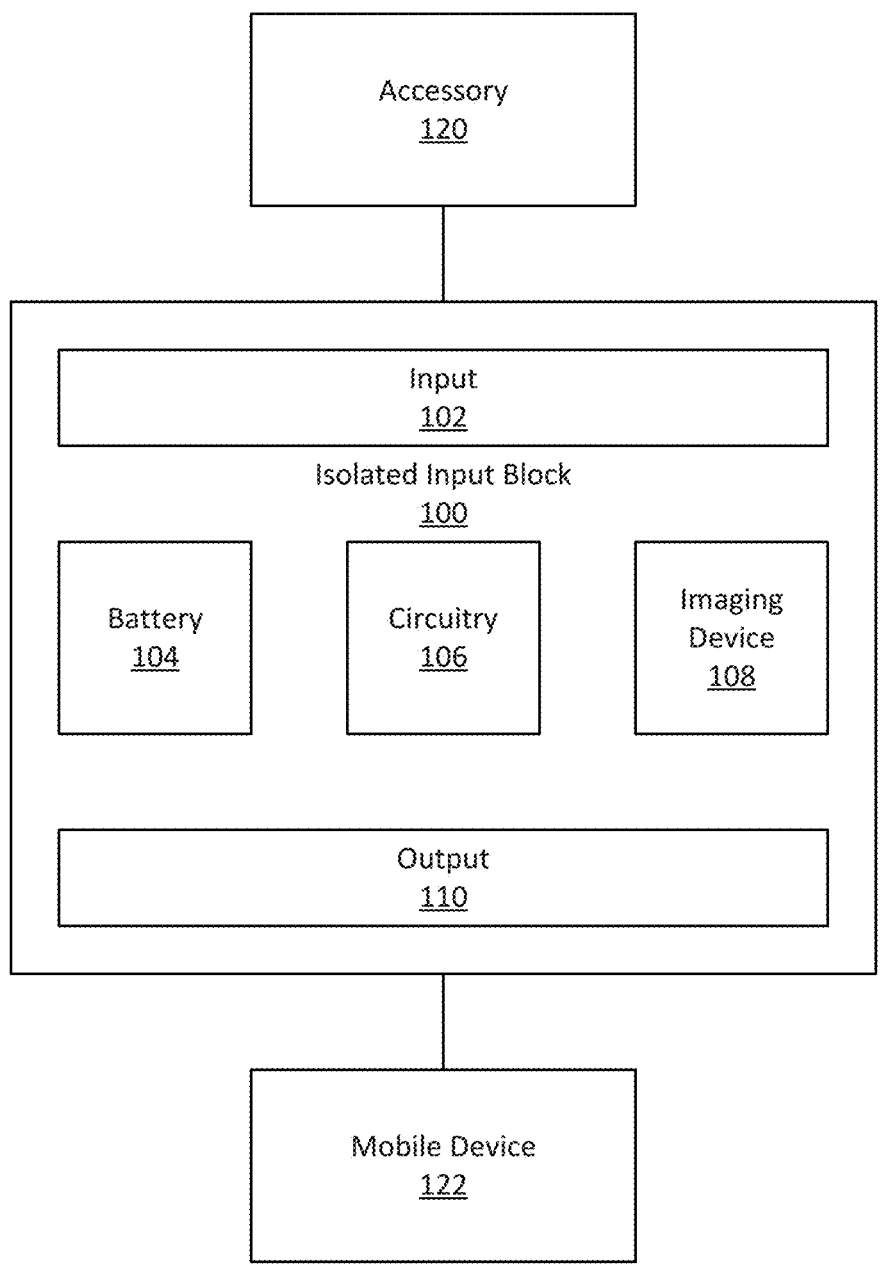
FIG. 1 is a schematic diagram of a system including an interface between a mobile device and an accessory via an isolated input block.

FIG. 1 is a schematic diagram of a system including an interface between a mobile device and an accessory via an isolated input block. In the illustrated system, an isolated input block 100 provides an interface between a mobile device 122 and one or more accessories 120. Mobile device 122 can be any portable device, such as a smartphone, tablet, laptop, and the like. In various embodiments, accessories 120 may include any of a variety of data- or other signal-producing devices. In some examples, accessory 120 may include accessories typically used with test and measurement tools, including but not limited to digital multimeters, power quality tools, current measurement tools, vibration tools, portable oscilloscope tools, laser alignment tools, ultrasonic test tools, insulation resistance testers, multi-function electrical test tools, single-function electrical test tools, contact temperature measurement tools, humidity measurement tools, air-flow measurement tools, air temperature measurement tools, air quality and particulate measurement tools, pressure measurement tools, gas detectors and analyzers. For instance, in various examples, accessories can include: test leads, current measurement loops (e.g., Rogowski Coils), current clamp accessories, 4-20 milliamp control loop accessories, accelerometer accessories, thermocouples and other contact measurement probes, acoustic accessories, voltage measurement probes, pressure transducers, gas sensors, torsional monitoring sensors, totalizer sensors, inclination and level sensors, conductivity and continuity sensors, turbitdity sensors, resistive level sensors, etc. In some examples, the one or more accessories can include a sensor or other accessory integrated into the isolated input block 100.

The isolated input block 100 of FIG. 1 includes one or more inputs 102 configured to interface with the one or more accessories 120. In general, input 102 may be any port or connector configured to interface with an accessory. For example, input 102 may include one or more input jacks configured to receive standard test leads (e.g., banana plugs, etc.) for performing a variety of measurements (e.g., voltage, current, resistance, etc.). Additionally or alternatively, input 102 may include communication with a sensor integrated into the isolated input block. In some examples, input 102 may include a specialized port or connector for interfacing with specific accessories. In some embodiments, input 102 may include a wireless receiver or transceiver configured to wirelessly receive information from an accessory.

Accordingly, the isolated input block 100 may receive accessory input data from one or more accessories 120 via input 102. The accessory input data may include data representative of at least one parameter of a device under test. For instance, in an exemplary embodiment, accessory 120 includes a current clamp configured to output a current or voltage based on the current flowing through an object. The output current or voltage from the current clamp (accessory) may be received as accessory input data by input 102 of isolated input block 100. In another example, accessory 120 can include a temperature measurement sensor integrated into the isolated input block 100 for outputting a signal indicative of the ambient temperature. The output of the temperature measurement sensor may be received as accessory input data by input 102 of isolated input block 100. Many other examples are possible using any combination of a variety of accessories capable of providing accessory input data to the input 102 of the isolated input block 100.

The isolated input block 100 of FIG. 1 includes circuitry 106. In some examples, circuitry 106 is configured to receive the accessory input data from input 102 to generate accessory output data. Circuitry 106 can include a variety of components capable of generating accessory output data. In some examples, circuitry can include at least one of an amplifier circuit, a filter circuit, an electrical isolation circuit, a conversion circuit (e.g., analog-to-digital conversion, current to voltage conversion, etc.), and the like. Various isolated input blocks may include different circuitry functions.

The isolated input block 100 can include an output 110 configured to output the accessory output data to a mobile device 122. Output 110 may be a connector configured to receive a corresponding connector from the mobile device 122, such as a serial connection, a USB or micro USB connection, or other wired connection. In some examples, the output 110 is configured to wirelessly communicate the accessory output data to the mobile device 122, for example, via radio frequency (RF) communication, infrared (IR) communication, WiFi communication, Zigbee, Bluetooth, etc.

In general, the accessory output data is representative of the accessory input data. For example, the accessory input data can include data acquired from one or more accessories 120, while the accessory output data is at least representative of such data. In some embodiments, the accessory output data communicated to the mobile device 122 is substantially the same as the accessory input data received by the isolated input block 100. In other examples, the accessory output data may be indicative of the received accessory input data, but is not necessarily the same. For example, circuitry 106 may process the received accessory input data to produce accessory output data that is different from the received accessory input data.

As described, in some configurations, one or more accessories 120 may be arranged to produce data indicative of at least one parameter of an object. In some instances, the mobile device is not equipped to handle certain loads, such as large amounts of electrical current flowing therethrough. For example, in the event that the accessory is configured to measure current flowing in a circuit or other device under test, and the current level spikes to an unusually high level, the mobile device or the safety of the user may be compromised.

Accordingly, in some examples, circuitry 106 of the isolated input block includes electrical isolation circuitry to electrically isolate the input 102 from the output 110. In such an example, such isolation circuitry can prevent the excess current from damaging the mobile device or injuring the operator holding the mobile device 122. In some embodiments, electrical isolation between an input 102 into the isolated input block 100 and the mobile device 122 can include any combination of capacitors, transformers, optoisolators, and the like. In some cases, the circuitry 106 of isolated input block 100 can include one or more fuses for preventing the flow of undesirably high current through one or more system components. Additionally or alternatively, electrical isolation between accessory 120 and the mobile device 122 can be provided by electrically isolating connections (e.g., wireless connections) at one or both of the input 102 or output 110 of the isolated input block 100. In some examples, electrical isolation can be provided as described in U.S. Provisional Patent Application No. 62/219,415 filed Sep. 16, 2015, and entitled "SYSTEMS AND METHODS FOR PLACING AN IMAGING TOOL IN A TEST AND MEASUREMENT TOOL," which is assigned to the assignee of the instant application, and which is hereby incorporated by reference in its entirety.

In some examples, the electrical isolation can be used to electrically isolate specific portions of any of the isolated input block, the mobile device, or the communication therebetween. For instance, input 102 of the isolated input block 100 can be galvanically isolated from further circuitry (e.g., 106) within the isolated input block. Accordingly, even in the event that the further circuitry is directly connected to the mobile device via an electrical connection, the mobile device and a user gripping the mobile device are electrically isolated from the device under test.

In some embodiments, electrical isolation can permit the transfer of data between the mobile device and the isolated input block while the two devices remain electrically isolated. Thus, in some configurations, the mobile device is capable of receiving accessory output data from the isolated input block corresponding to accessory input data representative of at least one parameter of a device under test. The mobile device may be configured to perform one or both of processing and displaying received data. In some embodiments, the mobile device is configured to determine and display the one or more parameters of the device under test from the received data.

In some embodiments, the isolated input block 100 can include one or more batteries 104 for providing the necessary electrical power for operation. For example, battery 104 may provide electrical power necessary for operation of circuitry 106, such as isolating circuitry. The battery of the isolated input block can be any known appropriate battery or other energy storage technology. In some instances, the battery 104 of the isolated input block 100 is rechargeable, for example, via a USB or micro-USB connection. In additional or alternative embodiments, the isolated input block 100 can share an electrical power source with the mobile device 122. In some such embodiments, the electrical power source of the mobile device 122 can be used to provide electrical power to operate the isolated input block 100 and/or to provide charge to the battery 104.

In some embodiments, the isolated input block can include one or more of any combination of cameras, imaging sensors, and optical systems (generally "imaging device"). The imaging device 108 of the isolated input 100 block can be sensitive to light over any number of wavelength ranges, including one or more of visible, NIR, SWIR, LWIR, terahertz (THz), ultraviolet (UV), X-Ray or other wavelengths.

Figure 2:
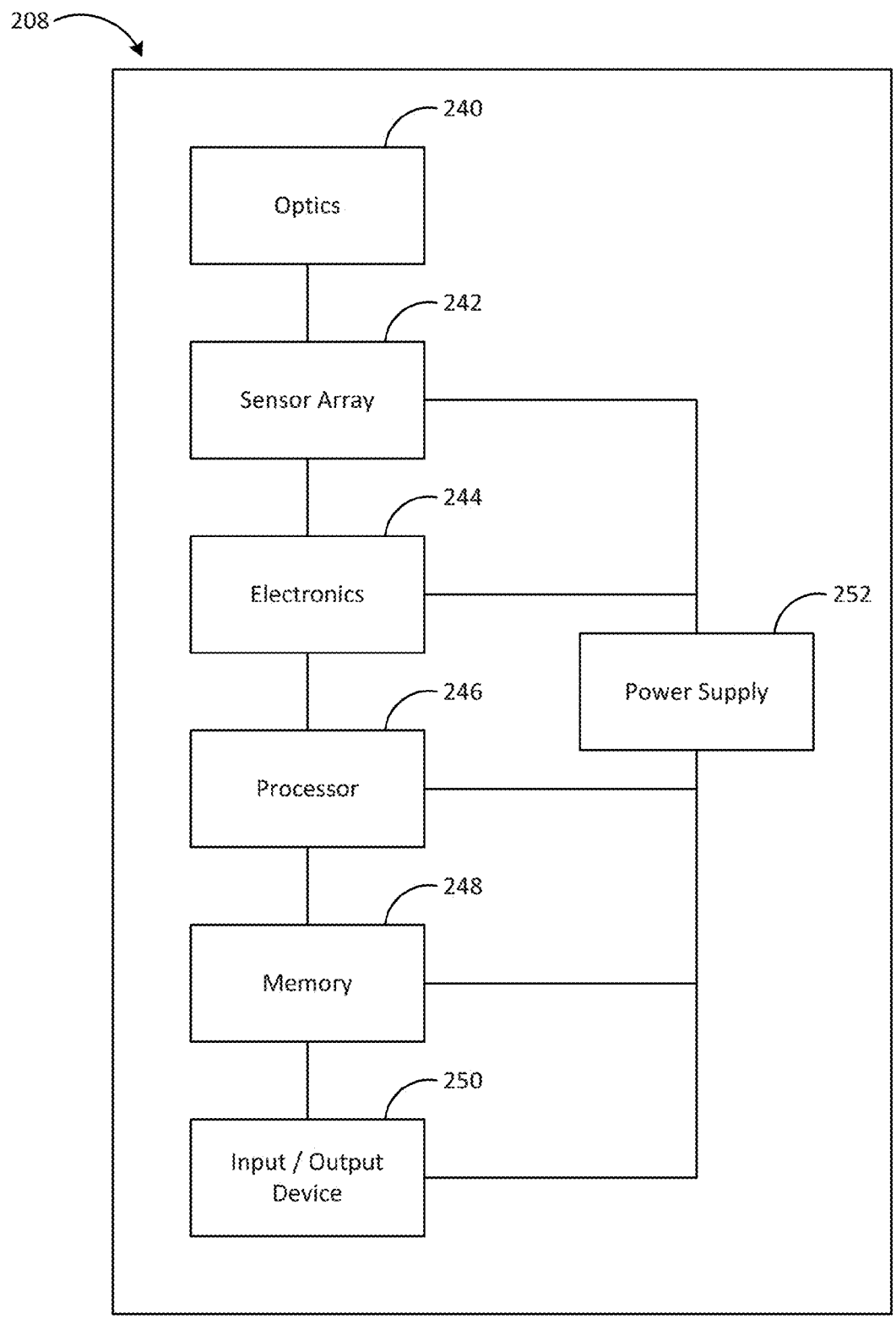
FIG. 2 shows an example block diagram of an imaging device configured for receiving electromagnetic radiation according to some exemplary systems.

FIG. 2 shows an example block diagram of an imaging device such as 108 configured for receiving electromagnetic radiation according to some exemplary systems. In the illustrated embodiment, imaging device 208 includes optics 240, a sensor array 242, electronics 244, one or more processors 246, memory units 248, input/output devices 250, and a power supply 252. It will be appreciated that, in various embodiments, additional components may be present. Additionally or alternatively, one or more of the illustrated components may be omitted. For example, the functionality of one or more components may be assumed by additional system components separate from imaging device 208

The optics 240 can include optics for focusing, deflecting, and/or reflecting electromagnetic radiation from a target object onto the sensor array 242. In some examples, the sensor array 242 may include an infrared sensor array sensitive to infrared radiation. An imaging device including such an infrared sensor array may be used to make non-contact temperature measurements. In some examples, the imaging device includes more than one sensor array. For instance, a first sensor array may be sensitive to a first band of wavelengths (e.g., infrared radiation) while a second sensor array may be sensitive to a second band of wavelengths (e.g., visible light radiation).

In such embodiments, the infrared sensor array 242 can include one or more thermal detectors such as microbolometers or thermopiles, or could be composed of photon detectors such as photodiodes or phototransistors, or other thermal or photon detection device. In some examples, an infrared sensor array may include a single detector, for instance, for determining a spot temperature within a target scene. Alternatively, an infrared sensor array may comprise a plurality of such detectors for acquiring at least one of a spot temperature (e.g., via an average value of sensor array sensors) and a two-dimensional infrared image.

One of skill in the art will recognize that various sensor arrays (e.g. photon sensor arrays) can be used, and can be used in combination with one or more infrared sensor arrays. In some examples, the sensor array is fixed within the imaging device 208 to provide a more durable device having fewer moving and moveable parts. In various examples, the size and positioning of the detector depends on the characteristics of the optical system (e.g., the relationship between optics 240 and sensor array 242). In some embodiments, the detector is generally circular having a diameter of 0.5 mm to 2 mm. However detectors of any size and shape should be considered within the scope of the invention. The detector produces a signal as a function of the radiation or other scene data imaged thereupon. These signals can be processed by known methods to indicate a temperature or other metric indicated via the received radiation.

A person of skill in the art will recognize that many materials and materials technologies may be suitable for use in an infrared sensor array. In some examples, the infrared sensor array 242 responds to infrared radiation ranging from approximately 0.7 microns to approximately 20 microns and can have a peak sensitivity within this range. The electronics 244 receive the output signals from the sensor array 242 and pass them to the processor 246 for analysis.

When an infrared sensor assembly is used, the processor 246 can be used to run infrared thermometer applications including, but not limited to, deciding if the target object sufficiently fills the field of view, and averaging output signals for a period of time to reduce the impact of noisy measurements on the accuracy of the measured temperature. In the case of alternative sensor arrays (e.g., sensitive to one or more of visible light, ultraviolet light, X-rays, etc.), the processor 246 may be used to run corresponding imaging applications. Such applications and/or acquired and processed image data may be stored in memory 248. Memory 248 can include but is not limited to, RAM, ROM, and any combination of volatile and non-volatile memory. In various examples, any combination of electronics 244, processor 246, and memory 248 may be located in a mobile device (e.g., 122) in communication with imaging device 208. Similarly, such components may be included in circuitry (e.g., 106) of the isolated input block.

A power supply 252 can include, but is not limited to, a battery, a parasitic energy system (e.g., an inductive system), and components for directly receiving AC power. The power supply 252 can provide power to the sensor array 242, electronics 244, processor 246, memory 248, and/or input/output devices 250. In some examples, power may be provided by a power source within a mobile device (e.g., 122) in communication with the isolated input block. Additionally or alternatively, power may be provided by a battery (e.g., 106) of the isolated input block.

An input/output device 250 can include, but is not limited to, triggers to start and stop the image capture, visual displays, speakers, and communication devices that operate through wired or wireless communications. In some examples, the input/output device 250 may receive signals from, for example, circuitry (e.g., 106) of the isolated input block initiating an image capture process. Additionally or alternatively, the input/output device 250 of the imaging device 208 can include a display capable of displaying an image produced from data conveyed or captured by one or more sensor arrays 242. In some examples, the input/output device 250 can be further configured to receive and/or show other data, for instance, accessory input data from one or more accessories (e.g., via input 102 to the isolated input block or other external sources).

Input/output device 250 can be capable of outputting image data representative of the electromagnetic radiation received by one or more sensor arrays 242. In some examples, the input/output device 250 is configured to output image data to circuitry (e.g., 106) of the isolated input block. Additionally or alternatively, input/output device 250 may output image data to an output (e.g., 110) of the isolated input block for communicating image data to a mobile device (e.g., 122) for one or both of processing and display.

As described, in some embodiments, mobile device (e.g., 122) can receive both accessory output data and image data from the isolated input block (e.g., 100) via an output (e.g., 110). Moreover, in some examples, accessory output data may be based on received data from one or more accessories (e.g., 120) that are electrically isolated from the mobile device. As described above, in some examples, circuitry (e.g., 106) of the isolated input block may receive accessory input data from one or more accessories and output corresponding accessory output data electrically isolated from the accessory input data. Thus, the mobile device and a user operating the mobile device are protected from otherwise potentially hazardous signals from accessories.

Figure 3:
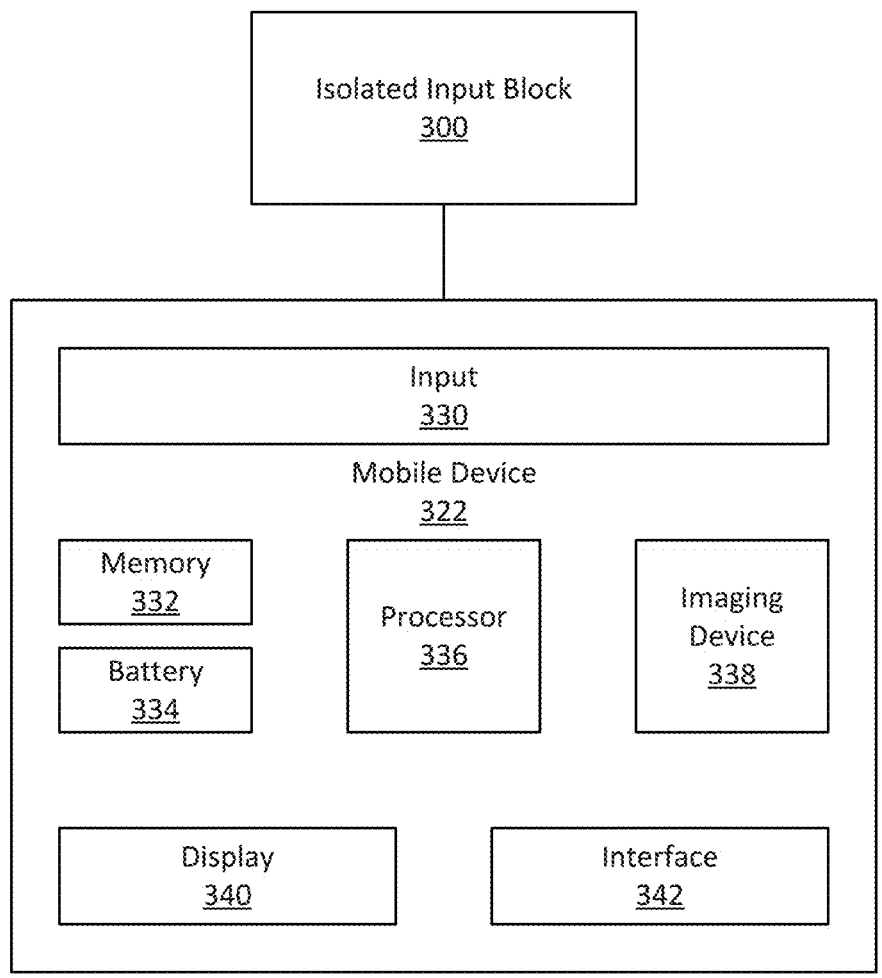
FIG. 3 is a schematic diagram showing exemplary configuration of a mobile device.

FIG. 3 is a schematic diagram showing exemplary configuration of a mobile device. Mobile device 322 may include devices such as a smartphone or a tablet, for example. As shown, mobile device 322 includes an input 330 for receiving signals such as accessory output data from at least one isolated input block 300. Communication between the isolated input block 300 and the input 330 of the mobile device 322 can be wired or wireless. In some embodiments, input 330 is a standard input common to typical mobile devices. In other examples, input 330 can be configured to interface with a particular mobile device or brand of mobile devices. Some exemplary inputs (e.g., 330) include a USB, micro USB, and lightning connectors.

In the illustrated embodiment, the mobile device 322 includes a processor 336. In some embodiments, processor 336 can process one or both of received accessory output data and image data. In some examples, processing data can include determining measurement data representative of a parameter of at least one device under test based on received accessory output data. Additionally or alternatively, processing received data can include the step of generating a display representative of the received data. The mobile device can include a display 340 for presenting the generated display to a user.

Processor 336 can process the data according, for example, to instructions stored in memory 332. For example, processing instructions may be defined by an application ("app") or other software running on the mobile device. As described, in some embodiments, accessory output data may be indicative of accessory input data representative of at least one parameter of a device under test. The processor 336 may receive the accessory output data from the isolated input block 300 via input 330 and determine measurement data representative of the at least one parameter of the device under test.

In an exemplary configuration, an accessory comprising a current measuring device, such as a current clamp, is arranged to measure the current of a device under test and is in communication with an input to an isolated input block. The accessory inputs accessory input data representative of the current flowing through the device to the isolated input block. Circuitry within the isolated input block receives the accessory input data and produces corresponding accessory output data. In some examples, the accessory output data is electrically isolated from the accessory input data. The accessory output data can be communicated to a mobile device. The received accessory output data may be processed in order to determine measurement data comprising the value of the current flowing through the device under test, even if the received accessory output data is not itself the current signal. For example, with respect to FIG. 3, the current flowing through the device under test may correspond to a voltage received at the input 330 of the mobile device 322. The processor 336 can determine, based on the received voltage at input 330, the value of the current flowing through the device under test. This may be done, for example, via a lookup table or equation stored in memory 332 correlating received output accessory data and corresponding accessory data.

In some examples, a mobile device 322 includes an imaging device 338. Imaging device 338 may include similar characteristics as imaging device 208 described in FIG. 2. In general, imaging device 338 of the mobile device 322 can be configured to receive radiation from a target scene and generate image data representative thereof. In some examples, the imaging device 338 of the mobile device 322 is used in addition to or instead of imaging device (e.g., 108) on an insulated input block for generating image data. For instance, in some examples, isolated input block may include an imaging device having a sensor array sensitive to a first band of wavelengths, while the imaging device 338 of the mobile device 322 may include a sensor array sensitive to a second band of wavelengths different than the first. In such an embodiment, image data from an imaging device 338 of the mobile device 322 may be complementary to image data from an imaging device in an isolated input block. In general, the processor 336 may be configured to acquire image data from one or both of an imaging device of the mobile device and an imaging device of an isolated input block. The processor 336 can be configured to process the image data for presentation on display 340.

In some embodiments, mobile device 322 includes an interface 342 for receiving input from a user. The interface may include at least one of a touchscreen, one or more buttons, one or more switches, or other known interface mechanisms. In some examples, a touchscreen may double as the display 340 and interface 342. In some embodiments, a user may select the type of accessory or accessories providing accessory input data to the isolated input block. The selection may be used by processor 336 to determine measurement data based on received accessory output data. That is, in some embodiments, a particular signal received at the input 330 of the mobile device 322 may correspond to a plurality of different parameters of the device under test depending on which accessories are being used. A selection via the interface 342 may assist in determining the measurement data corresponding to the accessory output data.

Mobile device 322 can include a battery 334 or other power source for providing electrical power for various system components, such as processor 336 and display 340. In some embodiments, battery 334 is in electrical communication with components of the isolated input block and can provide electrical power for operation of such components. Additionally or alternatively, battery 334 may be in communication with a battery of the isolated input block such that one of the batteries may be used to recharge the other. Battery 334 may be rechargeable by any appropriate method.

In the condition that the isolated input block or mobile devices includes one or more imaging devices, the received accessory data (or measurement data generated therefrom) can be presented simultaneously with acquired image data. For instance, in an exemplary configuration, a device for measuring the current flowing through a circuit can interface with the isolated input block. Additionally, the isolated input block can include an infrared (IR) camera for generating IR data of a target scene. Accordingly, the IR camera can acquire IR image data of the circuitry through which the current is flowing while the current is measured via the accessory. The isolated input block or the mobile device can process the received accessory data and the received IR image data to generate a display comprising the IR image data and the received accessory data to present on the mobile device. In some examples, the accessory data can be processed into measurement data, and the image data and the measurement data can be combined, for example, as described in U.S. Patent Publication No. US20140278259, corresponding to U.S. patent application Ser. No. 14/214,600, filed Mar. 14, 2014, and entitled "CAPTURE AND ASSOCIATION OF MEASUREMENT DATA," which is assigned to the assignee of the instant application, and which is hereby incorporated by reference in its entirety.

Figure 4:
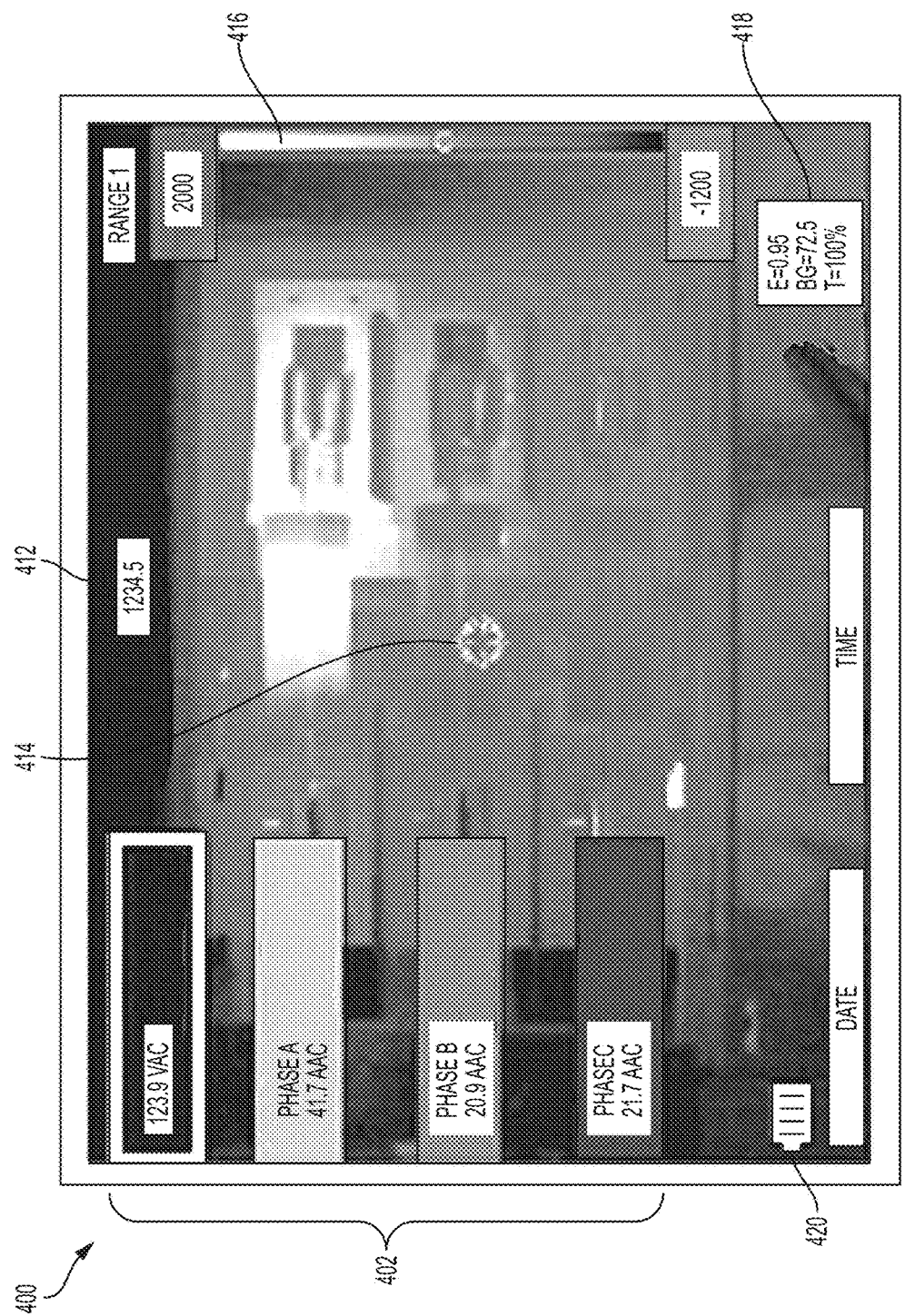
FIG. 4 is an exemplary display showing combined image and measurement data.

FIG. 4 is an exemplary display showing combined image and measurement data. In the illustrated example, the display 400 includes measurement data 402 comprising values of current flowing through three conductors and a measured voltage. In some examples, measurement data 402 may be acquired from a single accessory or set of accessories capable of measuring both current and voltage. In other examples, measurement data 402 comprising both voltage and current data may be acquired from a plurality of accessories providing accessory input data to a plurality of isolated input blocks in communication with the mobile device.

In still further embodiments, known information regarding the object under test may be used to supplement measurement data. For instance, if the resistance values of the conductors of FIG. 4 are known, voltage or current measurements may be used to calculate the other. In some such examples, supplementary information such as resistance values may be stored in memory or input by a user via a user interface, for example in response to a prompt.

In the illustrated embodiment, image data presented on the display includes infrared image data representative of the thermal pattern across the scene. Image data may be provided from an imaging device disposed on one or both of the isolated input block and the mobile device. In the illustrated example, the display 400 includes temperature information 412 representative of the temperature of a selected spot 414 on the display. In some examples, a user may adjust the location of spot 414 for displaying a temperature of an area of interest. The display 400 includes a temperature scale 416 that associates colors within a palettized IR image to corresponding temperature values. Any appropriate palettization scheme may be used, such as grayscale, red-blue, ironbow, amber, and others. The temperature scale 416 may be used to provide an indication to a viewer of the temperature of various points in the scene without requiring the placing of spot 414 over each point.

In some embodiments, other data 418 can be included in the display. Such data can include supplementary information for the image data (e.g., an emissivity value) or the measurement data. Other information that can be displayed includes battery life information 420 or information data received from one or more other devices or a network such as the internet. In various examples, such data can include information from specifications, FAQs, operating instructions, and the like.

Processing of image and/or measurement data to generate display such as shown in FIG. 4 may be performed entirely in the mobile device, entirely in the isolated input block, or may be split between the two. Capturing of image data via a camera may be initiated by the mobile device, either automatically or in response to an input from an interface. The mobile device can act as a display for presenting the detected or captured image data from the imaging device to a user.

As described, an imaging device can include a plurality of sensor arrays configured to detect light across different wavelength ranges, such as infrared and visible light. In other embodiments, multiple imaging devices can be configured to similarly detect light across different wavelength ranges. Accordingly, image data received by the mobile device may include image data representative of different wavelength representations of a target scene, such as infrared and visible light image data. In various embodiments, the mobile device can process and present image data (e.g., infrared and visible light image data) as described in U.S. Pat. No. 7,535,002, entitled "CAMERA WITH VISIBLE LIGHT AND INFRARED BLENDING," which is assigned to the assignee of the instant application, and which is hereby incorporated by reference in its entirety.

Mobile devices may integrate with isolated input blocks in a variety of ways. For example, in various embodiments, an isolated input block can be attached to a mobile device on any of the top, bottom, or sides of the mobile device. The isolated input block can be attached either permanently or may by temporarily attached. Among various embodiments of the isolated input block, the mobile device can slide into or clip onto the isolated input block. In some examples, the mobile device can be docked or undocked from the isolated input block. As described herein, when attached, the isolated input block and the mobile device can communicate in order to allow processing or display functions of data from the isolated input block by the mobile device. In various embodiments, the isolated input block can communicate with the mobile device via a direct wired connection. In other embodiments, the communication between the isolated input block and the mobile device can be wireless.

Figure 5:
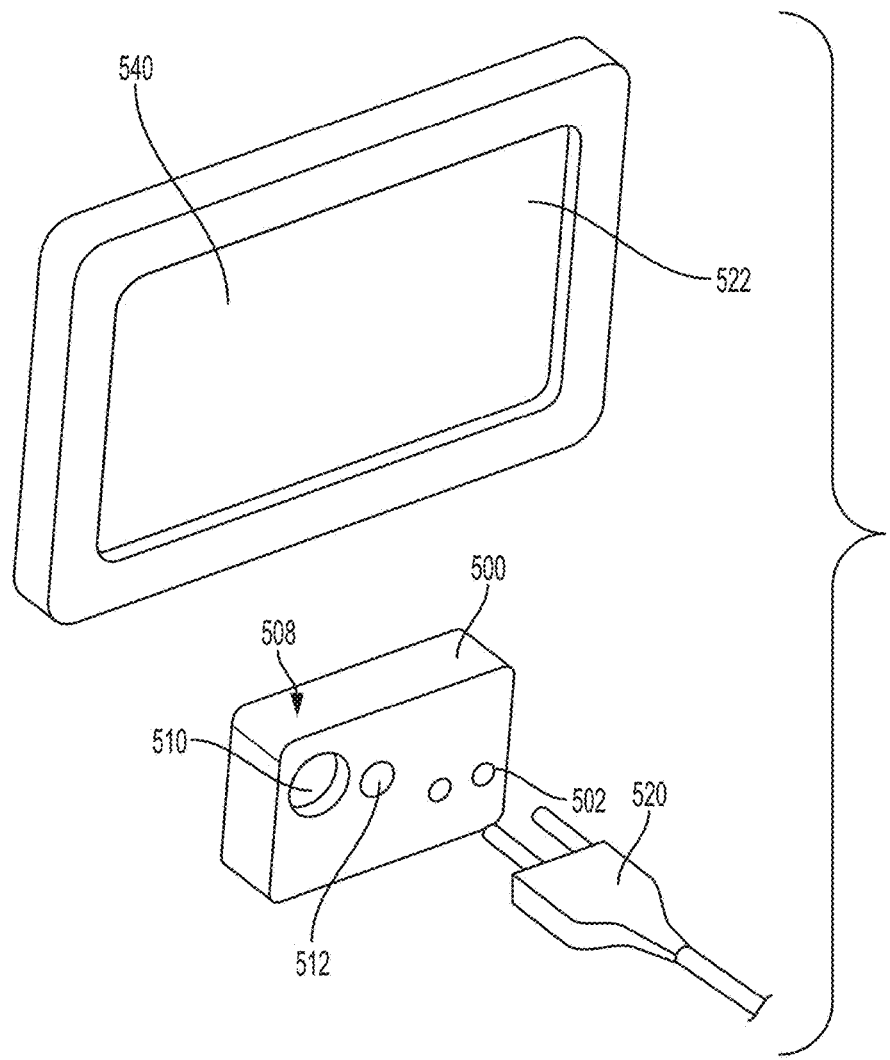
FIGS. 5-7 illustrate various embodiments of isolated input blocks interfacing with various mobile devices.
Figure 6:
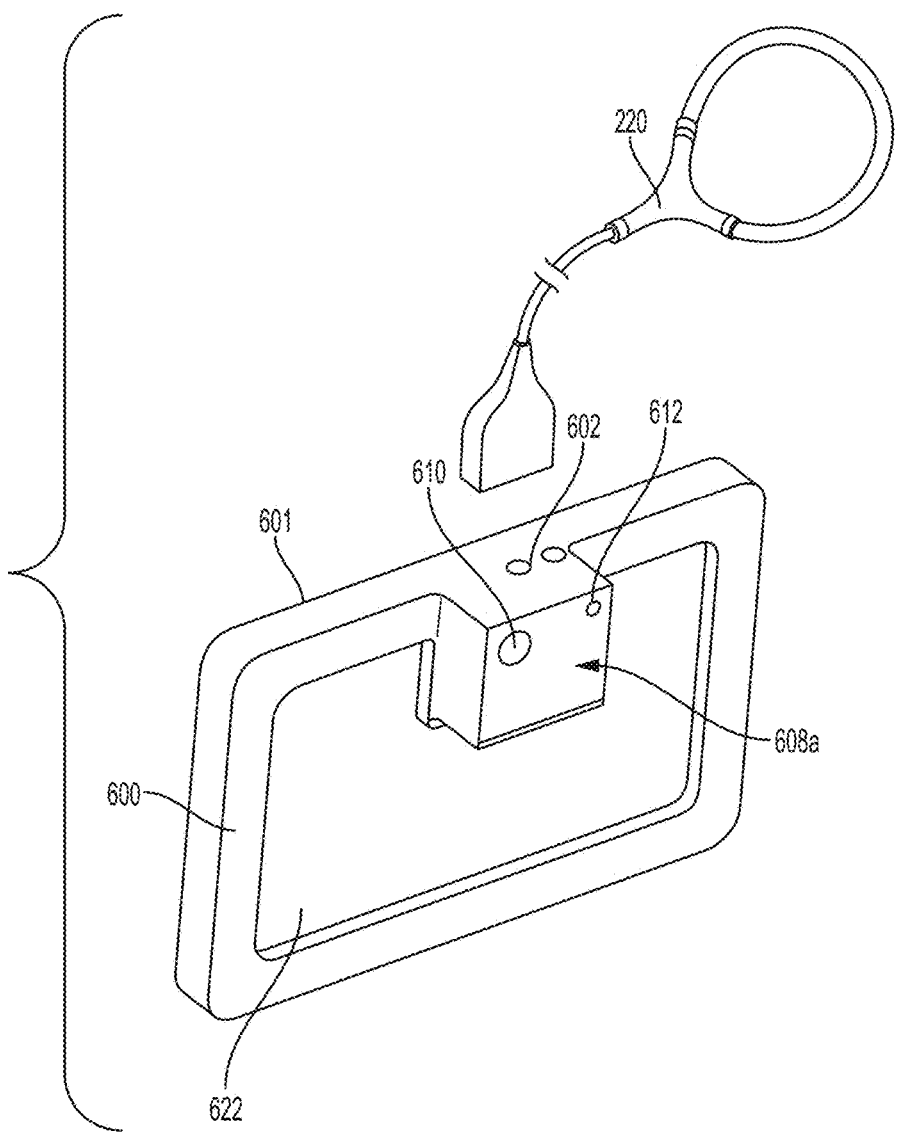
Figure 7:
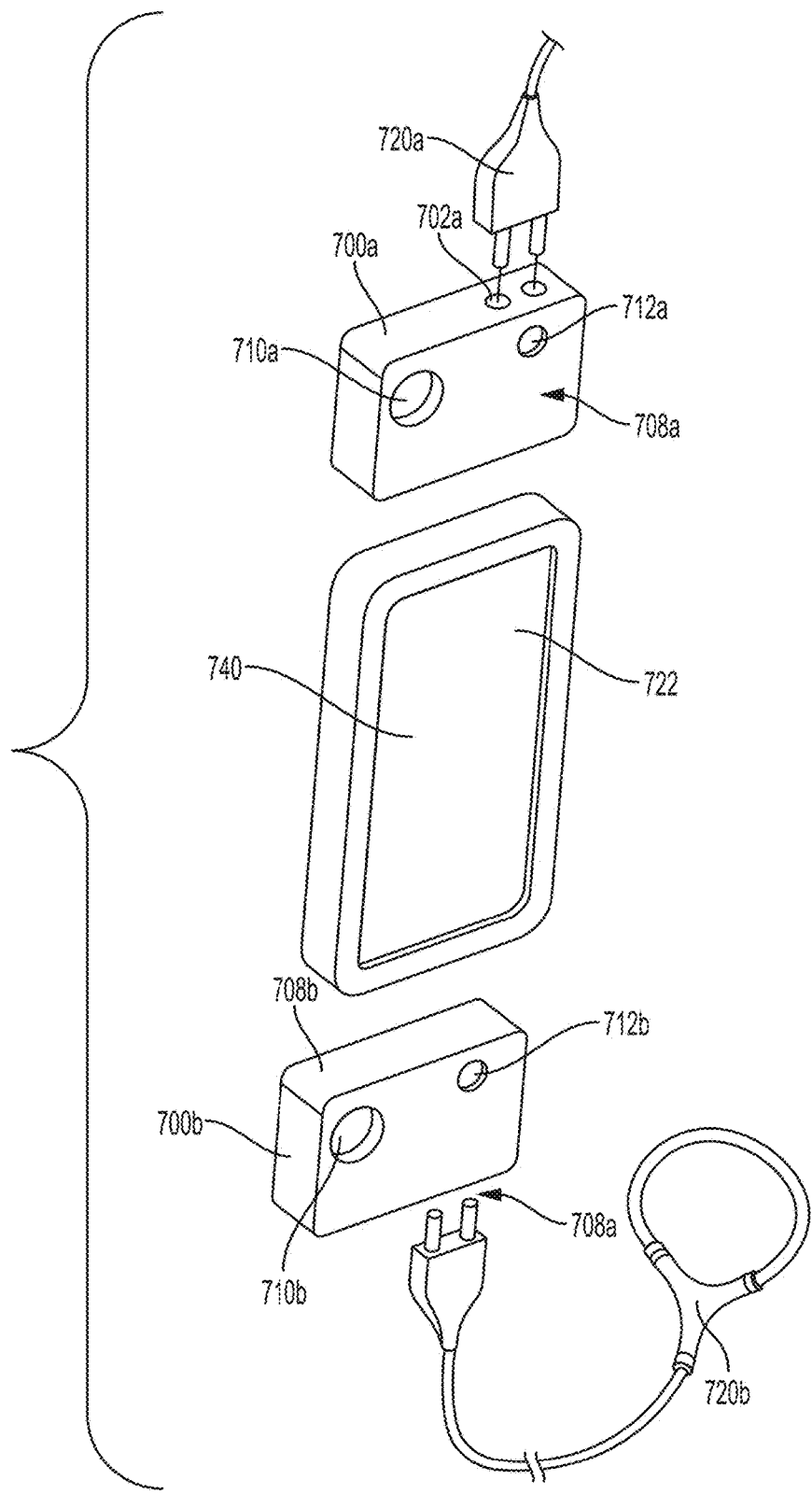

FIGS. 5-7 illustrate various embodiments of isolated input blocks interfacing with various mobile devices. FIG. 5 shows an isolated input block 500 including an imaging device 508 that includes infrared (IR) camera 510 and a visible light (VL) camera 512. Isolated input block 500 includes an accessory input 502 for interfacing with an accessory 520. Isolated input block 500 can be configured to interface with mobile device 522, which can be a tablet, smartphone, or other appropriate mobile device, and interact as described herein. Communication between the isolated input block 500 and the mobile device 522 can be hardwired or wireless. In some such examples, the isolated input block 500 can be configured to be mounted onto the mobile device.

As described, one or both of the isolated input block 500 and the mobile device 522 may include processing or other circuitry components. During exemplary operation, mobile device 522 can receive accessory input data from the accessory 520 via input 502. The accessory input data can be representative of at least one parameter of a device under test. The isolated input block 500 can output accessory output data to the mobile device 522 that corresponds to and is electrically isolated from the accessory input data. In some examples, the mobile device 522 is capable of determining measurement data representing the at least one parameter of the device under test based on the received accessory output data.

The imaging device 508 can generate visible light and infrared image data of the device under test via the visible light camera 512 and the infrared camera 510, respectively. In some examples, the visible light and infrared image data can be combined in a single display according to known techniques, such as one or both of picture-in-picture display and alpha blending. Visible light and infrared image data may be processed and prepared for display in one or both of the isolated input block 500 and the mobile device 522.

The mobile device 522 can be configured to present one or both of measurement data and image data on a display 540. For example, the mobile device 522 can be configured combine measurement data and image data for simultaneous presentation, such as shown in FIG. 4. In some embodiments, contents or other properties of the generated display may be adjustable by a user via an interface.

FIG. 6 shows an isolated input block 600 having an imaging device 608 including an IR camera 610 and a VL camera 612. The isolated input block 600 includes an accessory input 602 for interfacing with an accessory 620 similar to FIG. 5. The isolated input block 600 of FIG. 6 substantially surrounds the mobile device 622 with which the isolated input block 600 interfaces. For example, in some such embodiments, the mobile device 622 can slide or press into the isolated input block 600 similar to a frame, so that the isolated input block 600 effectively surrounds the perimeter of the mobile device 622. Isolated input block 600 may serve as a protective element for mobile device 622, for example, protecting against minor impacts. Operation of the mobile device 622 and the isolated input block 600 may be similar to that described above with respect to the mobile device and isolated input block of FIG. 5.

In some configurations multiple isolated test blocks (e.g., 700a and 700b) can interface with a single mobile device simultaneously. FIG. 7 is an exemplary configuration of multiple isolated test blocks operating with a mobile device. FIG. 7 shows a mobile device 722 interfacing with two isolated input blocks 700a, 700b. As shown, isolated input block 700a includes an imaging device 708a having an IR camera 710a and a VL camera 712a. Isolated input block 700a includes an accessory input 702a for interfacing with an accessory 720a similar to FIGS. 5 and 6. As shown, isolated input block 700a is configured to interface with the top of the mobile device 722. Similarly, isolated input block 700b includes an imaging device 708b having an IR camera 710b and a VL camera 712b. Isolated input block includes an accessory input 702b for interfacing with an accessory 720b. As shown in the illustrated example, isolated input block 700b is configured to interface with the bottom of the mobile device 722. Mobile device 722 includes a display 740 for displaying any variety of received data or representations thereof In some examples, the mobile device 722 can provide one or both of processing and display capability for any of various imaging devices (e.g., 710a, 710b, 712a, 712b) on either or both isolated test blocks. Similarly, the mobile device 722 can provide processing and/or display for data associated with accessories (e.g., 720a, 720b) coupled to different isolated input blocks (e.g., 700a, 700b) by accessory inputs (e.g., 702a, 702b). By interfacing with multiple isolated test blocks, the mobile device can be provided with a large amount of data for display. In various embodiments, the mobile device can receive any number of data sets or signals from any number of isolated test blocks coupled to any number of accessories, and generate a display including any of the received data sets or signals. In some examples, a user may select a subset of available data (e.g., measurement data, image data, etc.) for display via a user interface.

Various embodiments have been described. Such examples are non-limiting, and do not define or limit the scope of the invention in any way. Rather, these and other examples are within the scope of the invention.

The invention claimed is:

1. A system comprising:
    an accessory configured to generate data representative of at least one parameter of a device under test;
    an isolated test block including
        at least one input for interfacing with the accessory and configured to receive accessory input data representative of the at least one parameter of the device under test; and
        an output configured to communicate accessory output data corresponding to the accessory input data; and
    a mobile device comprising a display and configured to receive accessory output data from the isolated test block via the output of the isolated test block; and present a display based at least on the received accessory output data; wherein
    the accessory output data received by the mobile device is electrically isolated from the accessory; and
    the isolated test block is configured such that the mobile device can be inserted into the isolated test block, and, when the mobile device is inserted, the isolated test block surrounds the perimeter of the mobile device.

2. The system of claim 1, wherein the isolated test block includes electrical isolation circuitry electrically isolating the mobile device from accessory.

3. The system of claim 2, wherein the isolated test block comprises at least one fuse.

4. The system of claim 1, wherein the isolated test block and the mobile device communicate wirelessly.

5. The system of claim 1, wherein the isolated test block can be removably attached to the mobile device.

6. The system of claim 1, wherein the accessory comprises a digital multimeter accessory.

7. The system of claim 1, further comprising at least one imaging device including a sensor array configured to receive radiation from a target scene and to generate image data representative of the target scene; and wherein the generated display further comprises image data representative of a target scene.

8. The system of claim 7, wherein
    the isolated test block comprises the at least one imaging device; and
    the mobile device is configured to receive image data from the isolated input block.

9. The system of claim 8, wherein the at least one imaging device comprises an infrared (IR) imaging device configured to generate IR image data and a visible light (VL) imaging device configured to generate VL image data, and wherein the received image data comprises IR and VL image data.

10. The system of claim 1, wherein the mobile device is a tablet, a mini-tablet, or a smartphone.

11. The system of claim l, wherein the mobile device is configured to determine the value of the at least one parameter of the device under test and generate measurement data comprising the determined value, and wherein the presented display includes the measurement data.

12. The system of claim 1, wherein the accessory comprises a first accessory configured to generate data representative of at least a first parameter of a first device under test and the isolated test block comprises a first isolated test block and further comprising:
    a second accessory configured to generate data representative of a second parameter of a second device under test, at least one of the second parameter and the second device under test being distinct from the at least one first parameter and the first device under test; and
    a second isolated test block comprising:
        at least one input for interfacing with the second accessory and configured to receive second accessory input data representative of the second parameter of the second device under test; and
        an output configured to communicate second accessory output data corresponding to the second accessory input data; wherein the mobile device is capable of simultaneously communicating with the output of the first isolated test block and the second isolated test block.

13. An isolated input block comprising:
   an input configured to interface with at least one accessory and to receive accessory input data from the at least one accessory;
   an imaging device capable of detecting radiation from a target scene and generating image data representative of the target scene; and
   an output configured to interface with a mobile device and to output image data and accessory output data based on and electrically isolated from the received accessory input data.

14. The isolated input block of claim 13, wherein the imaging device comprises a visible light (VL) imaging device configured to generate VL image data representative of a first target scene and an infrared (IR) imaging device configured to generate IR image data representative of a second target scene that at least partially overlaps the first target scene.

15. The isolated input block of claim 13, further comprising circuitry configured to:
   receive accessory input data from the input;
   generate accessory output data based on the accessory input data; and
   output accessory output data to the output.

16. The isolated input block of claim 15, wherein the circuitry comprises electrical isolation circuitry configured to electrically isolate the accessory output data from the accessory input data.

17. The isolated input block of claim 13, wherein, when interfacing with the mobile device, the isolated input block substantially surrounds the perimeter of the mobile device.

18. The isolated input block of claim 13, wherein at least one of the input and output is capable of wireless communication.

19. A method of displaying information associated with a device under test comprising:
   receiving accessory input data from an accessory, the accessory input data representative of at least one parameter of the device under test;
   generating, based on the accessory input data, accessory output data;
   communicating the accessory output data to a mobile device, the communicated accessory output data being electrically isolated from the received accessory input data;
   receiving image data representative of a target scene including the device under test;
   communicating the image data to the mobile device; and
   generating and presenting a display on the mobile device including data representative of the communicated accessory output data and the received image data.

20. The method of claim 19, wherein the data representative of the communicated accessory data comprises measurement data indicating the value of the at least one parameter of the device under test.

21. The method of claim 19, wherein receiving image data representative of a target scene including the device under test comprises receiving infrared image data representative of a thermal scene including the device under test and the display includes infrared image data including temperature information of the device under test.

22. The method of claim 19, wherein receiving image data and communicating the image data to the mobile device comprises receiving image data using a camera built-in to the mobile device.

* * * * *